United States Patent [19]

Hulick

[11] Patent Number: 5,367,272

[45] Date of Patent: *Nov. 22, 1994

[54] DIGITAL AMPLITUDE MODULATORS INVOLVING (1) MODIFICATION OF AMPLITUDE DURING SYNCHRONIZATION PULSE, (2) AUTOMATIC GAIN CONTROL OF SIGNAL COMPONENTS, AND/OR (3) ANALOG REPRESENTATION OF LESS SIGNIFICANT SIGNAL COMPONENTS

[75] Inventor: Timothy P. Hulick, Schwenksville, Pa.

[73] Assignee: Acrodyne Industries, Inc., Blue Bell, Pa.

[*] Notice: The portion of the term of this patent subsequent to Nov. 9, 2010 has been disclaimed.

[21] Appl. No.: 84,026

[22] Filed: Jun. 30, 1993

Related U.S. Application Data

[63] Continuation of Ser. No. 924,525, Aug. 4, 1992, Pat. No. 5,260,674.

[51] Int. Cl.[5] ............................................. H03C 1/00
[52] U.S. Cl. ................................. 332/149; 332/159; 455/108
[58] Field of Search .................. 332/149, 155–158, 332/159; 341/126, 132, 139, 144, 145, 155; 455/108

[56] References Cited

U.S. PATENT DOCUMENTS

| | | | |
|---|---|---|---|
| 3,480,881 | 11/1969 | Boykin | 332/149 |
| 3,490,054 | 1/1970 | Seidel . | |
| 3,678,415 | 7/1972 | Kuroda | 333/9 |
| 3,827,001 | 7/1974 | Laughlin | 333/9 |
| 3,869,585 | 3/1975 | Snyder | 179/173 |
| 4,182,996 | 1/1980 | Spence | 333/100 |
| 4,403,197 | 9/1983 | Swanson | 330/10 |
| 4,514,699 | 4/1985 | Kariatsumari et al. | 350/53 |
| 4,534,040 | 8/1985 | Thapar | 375/39 |
| 4,571,549 | 2/1986 | Lods et al. | 375/39 X |
| 4,580,111 | 4/1986 | Swanson | 455/108 X |
| 4,654,608 | 3/1987 | Minarik et al. | 375/61 X |
| 4,661,948 | 4/1987 | Shapiro et al. | 370/77 |
| 4,804,931 | 2/1989 | Hulick | 332/149 X |
| 5,185,586 | 2/1993 | Zucker | 331/96 |
| 5,260,674 | 11/1993 | Hulick | 332/149 |

Primary Examiner—David Mis
Attorney, Agent, or Firm—Popham, Haik, Schnobrich & Kaufman, Ltd.

[57] ABSTRACT

A first aspect of the present modulator provides for a reduction in an otherwise maximum level of an analog input signal during a particular time period (for example, the period of the synchronization pulse in an analog television format). When the normally predictable high-amplitude portion is reduced in amplitude, combiner power efficiency is increased. To regain the full amplitude, the gain of the amplifier corresponding to the most significant bit of the digitized signal being modulated, is increased. A second aspect of the present modulator provides an automatic gain control AGC arrangement especially suitable for the modulator of U.S. Pat. No. 4,804,931. The AGC arrangement is based on a circuit that is governed by the output of a respective amplifier as well as by the binary value of the respective bit corresponding to the significance of the amplifier and a reference value related to the bit's significance. Finally, a third aspect of the modulator minimizes component count by providing a hybrid modulator-transmitter. Lower-order bits of a signal to be modulated contribute to the modulated waveform via an analog-processed portion which does not closely follow the teachings of the '931 patent, providing an optimum balance between power savings and component cost and complexity.

33 Claims, 7 Drawing Sheets

DIGITAL AMPLITUDE MODULATORS INVOLVING (1) MODIFICATION OF AMPLITUDE DURING SYNCHRONIZATION PULSE, (2) AUTOMATIC GAIN CONTROL OF SIGNAL COMPONENTS, AND/OR (3) ANALOG REPRESENTATION OF LESS SIGNIFICANT SIGNAL COMPONENTS

CROSS-REFERENCE TO RELATED APPLICATION AND PATENT

The present patent application is a continuing patent application of U.S. patent application Ser. No. 07/924,525, filed Aug. 4, 1992, which issued Nov. 9, 1993 as U.S. Pat. No. 5,260,674 to the same inventor and assigned to Acrodyne Industries, Inc.

The present patent application is also related to U.S. Pat. No. 4,804,931, issued Feb. 14, 1989 to the same inventor and assigned to Acrodyne Industries, Inc. Both documents are incorporated herein by reference.

BACKGROUND OF THE INVENTION

1. Field of the Invention

The present invention relates to modulators. More specifically, the invention relates to various improvements in modulators such as that disclosed in U.S. Pat. No. 4,804,931. As such, the present invention is especially useful in amplitude modulators that are capable of generating pseudo-continuous amplitude modulation at any modulation index between 0 and 1 with any vast array of carrier frequencies using almost any class of amplifier.

2. Related Art

In U.S. Pat. No. 4,804,931 (which is incorporated herein by reference in its entirety), a digital amplitude modulator-transmitter is described. An amplitude modulator-transmitter embodying the teachings of the '931 patent is illustrated in FIG. 1.

The amplitude modulator 30 includes a predetermined number of quadrature hybrid power devices $32_1$-$32_n$. The quadrature hybrid power devices $32_1$-$32_n$ are configured as combiners, and are arranged in cascade so that the output of one combiner is the first of two inputs of a successive combiner. In the exemplary illustration of FIG. 1, only four combiners are shown for ease of understanding.

The construction and operation of a quadrature hybrid device is described in detail in the '931 patent, and need not be described here. However, for purposes of the present discussion, a quadrature hybrid combiner may be implemented as a four-port device having first and second inputs, one output, and one isolated port. The first and second inputs receive two signals of a given amplitude that are 90° apart in phase. The input signals are combined to provide an output signal having an amplitude that is the sum of the amplitudes of the input signals. As shown in FIG. 1, ports 1 and 4 represent the first and second input ports. Port 3 represents an isolation port to which is attached a resistor representing a dummy load 34. Finally, port 2 defines the output port of each of the combiners.

An analog signal source 36, such as a microphone or a video generator, produces an analog signal that passes through an analog-to-digital converter (A/D converter, or ADC) 38. The digital output of the A/D converter appears on data lines 40.

As an example, there are four data lines, so that data consists of four-bit words. However, it is contemplated that 12- or 16-bit words may be employed to improve the quality of the signals being transmitted. Further, it is contemplated that a digital input signal may be fed directly to gates 42 without the need for A/D converter 38, should the modulating signal already exist in binary form.

Each of the bits, from the least significant bit (LSB) to the most significant bit (MSB), controls a respective gate $42_1$-$42_n$. Each of the gates is connected in series with a corresponding amplifier $44_1$-$44_n$. The series combinations receive an RF signal from an RF signal generator 46, and provide respective second inputs to the combiners.

The output port of the LSB combiner $32_1$ represents the least significant bit of the digital word describing the instantaneous value of the signal to be modulated. The second input of the combiner $32_2$, adjacent the LSB combiner $32_1$, represents a value that is twice as significant as that of the second input of the LSB combiner $32_1$. Similarly, the second input of each successive combiner represents a value twice as significant as that input to the immediately preceding combiner.

Thus, the output of each combiner represents a binary weighted power signal. In particular, the signal appearing at the output of the MSB combiner $42_n$ represents the sum of the power signals fed into the various combiners. This output signal is fed for transmission to a load, typically an antenna with conventional filtering.

The power efficiency of the digital amplitude modulator-transmitter is described in equation 24 of the '931 patent:

$$\eta = \frac{\left[1 + \sum_{k=1}^{n} m_k 2^{k-1}\right]}{2^n} \tag{101}$$

where $m_k$ is the modulation index (0=off, 1=on) of the k-th bit of the binary signal on path 40 and n is the number of bits in the word. Specifically, this is the power efficiency of the combining network with intentionally wasted power in the combiner reject loads when all RF driving sources are not gated ON (that is, when all $m_k$ are not unity). It is this intentional waste of power that causes the system in the '931 patent to be a linear amplitude modulator-transmitter.

The Applicant of the present patent application has realized that wasted power should be minimal at the highest capable peak power of the modulator-transmitter. In fact, when all driving sources (gates 42) ON (all $m_k = 1$), power efficiency is 100% in the combiner. However, combiner power efficiency cannot readily be improved if the modulation source is completely random, unpredictable and aperiodic. This is seldom the case, however, and it will be shown below with reference to a first aspect of the present invention, that significant power efficiency increases may be achieved when occurrences of peak power are predictable and frequent.

On a second matter relating to amplifiers in the '931 patent and amplifiers in general, it is desirable that output power be maintained constant, at least for a given time period. However, the magnitude of output power of RF amplifiers may drift for a variety of reasons, including variations in the temperature of the device, changes in power supply voltage, and load impedance. Despite these confounding influences, it is desirable from a modulation standpoint to maintain the output power of the amplifiers constant during periods in which they are turned on. A second aspect of the present invention is directed to an improvement which fulfills this need.

Third, it is desirable to minimize component count and circuit complexity, while serving as many of the above-mentioned needs as possible. A third aspect of the present invention fulfills this need.

SUMMARY OF THE INVENTION

A first aspect of the present invention provides for a reduction in an otherwise maximum level of an analog input signal during a particular time period (for example, the time period of the high-amplitude synchronization pulse in an analog television format). In a particular preferred embodiment, the first aspect of the invention reduces the otherwise maximum value to a value which does not rise above the peak of a normally lower (for example, burst) level. When the normally high-amplitude portion is thus reduced in amplitude, efficiency is substantially increased when power efficiency is most important. To retrieve the full amplitude during the period of maximum amplitude (for example, the synchronization pulse period), an amplifier corresponding to the most significant bit of the analog signal being modulated, compensates for the reduced level of the input signal. In a particular preferred embodiment, the amplifier's compensation is accomplished by increasing the amplifier's supply voltage.

When considered as an improvement to the modulator of the '931 patent, the first aspect of the present invention provides a modulator for modulating an input information signal to provide a modulated information signal, the modulator having a circuit for determining when a magnitude of the input information signal is at or above a given magnitude threshold, and means for providing a modified input information signal in response to the means for determining. The modulator also has several component signal generation devices, the component signal generation devices outputting a corresponding plurality of component signals, in which each component signal output generally has a strength that is a predetermined multiple of a strength of a component signal of a preceding component signal generation device, and in which the modified input information signal controls the magnitude of the plurality of component signals. The modulator also has means for compensating for a difference between the input information signal and the modified input information signal, the means for compensating increasing the magnitude of a component signal output by a component signal generation device other than a least significant component signal generation device. Finally, the modulator has several combiners arranged in cascade, each combiner being connected to a respective component signal generation device, in which each combiner after a first combiner combines (i) a combiner output from a previous combiner and (ii) the component signal output from its respective component signal generation device, and in which a last combiner provides the modulated information signal as indicative of a sum of the component signals.

A second aspect of the present invention provides an automatic gain control system especially suitable for the modulator-transmitter of the '931 patent. A preferred embodiment of an automatic gain control arrangement is based on a circuit that is governed by the output of a respective amplifier 44 as well as by the binary value of the respective bit corresponding to the amplifier and a reference value related to the bit's significance. The gain control port of the amplifier is preferably controlled by a filtered output of a comparator that compares the output of the amplifier to a suitable reference value. Applying this aspect of the present invention to the circuit disclosed in the '931 patent, the suitable reference value is specially related to the significance of the bit corresponding to the amplifier. This arrangement allows output power to be maintained substantially constant, providing improved modulation performance.

When considered as an improvement to the modulator of the '931 patent, the second aspect of the present invention provides a modulator for modulating an input information signal to provide a modulated information signal, the modulator having several component signal generation devices, the component signal generation devices outputting a corresponding number of component signals, in which each component signal output has a strength that is a predetermined multiple of a strength of a component signal of a preceding component signal generation device, and in which the input information signal controls the magnitude of the plurality of component signals. The modulator has several automatic gain control portions, connected to a corresponding number of component signal generation devices, for ensuring that each component signal generation device outputs component signals of substantially constant power over time. Finally, the modulator has several combiners arranged in cascade, and each combiner being connected to a respective component signal generation device, in which each combiner after a first combiner combines (i) a combiner output from a previous combiner and (ii) the component signal output from its respective component signal generation device, and in which a last combiner provides the modulated information signal as indicative of a sum of the component signals, the modulated information signal having a substantially constant output power over time due to the automatic gain control portions.

A third aspect of the invention minimizes component count by providing a hybrid modulator-transmitter. In the hybrid modulator-transmitter, lower-order bits of a signal to be modulated contribute to the modulated waveform via an analog-processed portion which does not closely follow the teachings of the '931 patent. However, the more significant bits of the signal to be modulated are processed through a digitally processed portion, so that certain power-saving features of the invention are applied to the more Significant portions of the digital words representing the signal to be modulated. This hybrid approach results in substantially equal power savings as a digitally processed circuit of greater overall complexity. In this manner, an optimum balance between power savings and component cost and complexity can be achieved.

When considered as an improvement to the modulator of the '931 patent, the third aspect of the present invention provides a modulator for modulating an input information signal to provide a modulated information signal, the modulator having several component signal generation devices, the component signal generation devices outputting a corresponding number of component signals, in which each component signal output has a strength that is a predetermined multiple of a strength of a component signal of a preceding component signal generation device, and in which more significant portions of the input information signal control the magnitude of the plurality of component signals. The modulator has an analog portion for providing an analog signal indicative of lees significant portions of the input information signal. The modulator also has several combiners arranged in cascade, and each combiner being connected to a respective component signal generation device, in which each combiner after a first combiner combines (i) a combiner output from a previous combiner and (ii) the component signal output from its respective component signal generation device, and in which the first combiner combines (i) the analog signal indicative of the less significant portions of the input information signal and (ii) the component signal output from its respective component signal generation device, and in which a last combiner provides the modulated information signal as indicative of a sum of the component signals.

BRIEF DESCRIPTION OF THE DRAWINGS

The invention is better understood by reading the following Detailed Description of the Preferred Embodiments with reference to the accompanying drawing figures, in which like reference numerals refer to like elements throughout, and in which.

DETAILED DESCRIPTION OF THE PREFERRED EMBODIMENTS

Figure 1:
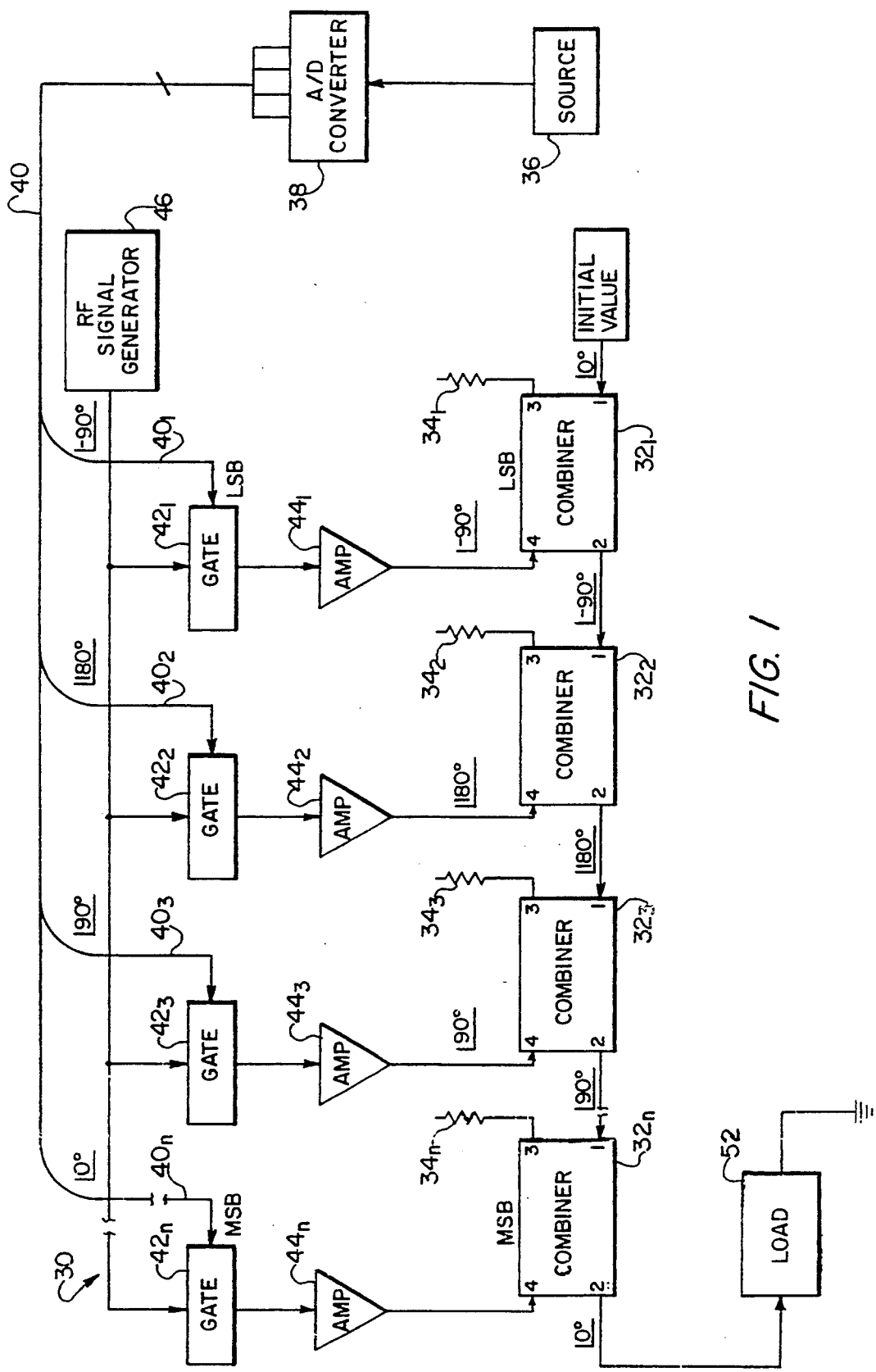
FIG. 1 illustrates a digital amplitude modulator-transmitter in part embodying the teachings of U.S. Pat. No. 4,804,931.

In describing preferred embodiments of the present invention illustrated in the drawings, specific terminology is employed for the sake of clarity. However, the invention is not intended to be limited to the specific terminology so selected, and it is to be understood that each specific element includes all technical equivalents which operate in a similar manner to accomplish a similar purpose.

Further, first, second, and third aspects of the invention are described herein, and are especially suitable for use in improving a digital amplitude modulator-transmitter of the type disclosed in U.S. Pat. No. 4,804,931. However, no inference should be made that the teachings of the present invention may be applied only to that modulator-transmitter, nor should the inference be made that all three aspects of the present invention need be present in order to fall within its scope.

Rather, the scope of the present invention, in all its aspects, combinations thereof, and applications, should be construed only by the claims at the end of this specification and by the equivalents thereof.

Applicant first describes the first aspect of the present invention.

As described above, in the Background of the Invention, the power efficiency of the digital amplitude modulator-transmitter is described in equation 24 of the '931 patent:

$$\eta = \frac{\left[1 + \sum_{k=1}^{n} m_k 2^{k-1}\right]}{2^n} \quad (101)$$

where $m_k$ is the modulation index (0=off, 1=on) of the k-th bit of the binary signal on path 40 and n is the number of bits in the word. Specifically, this is the power efficiency of the combining network with intentionally wasted power in the combiner reject loads when all RF driving sources are not gated ON (that is, when all $m_k$ are not unity). It is this intentional waste of power that causes the system in the '931 patent to be a linear amplitude modulator-transmitter.

The Applicant of the present patent application has realized that wasted power should be minimal at the highest capable peak power of the modulator-transmitter. In fact, when all driving sources (gates 42) ON (all $m_k = 1$), power efficiency is 100% in the combiner. However, combiner power efficiency cannot readily be improved if the modulation source is completely random, unpredictable and aperiodic. This is seldom the case, however, and according to the first aspect of the present invention significant power efficiency increases may be achieved when occurrences of peak power are predictable and frequent.

For example, in the case of an analog television format (such as many of the CCIR lettered formats), a periodic synchronization pulse represents the highest output power of a television transmitter. The region of the video waveform used for synchronization pulse, blanking and color burst is known, and is a good example of a signal in which occurrences of peak power are predictable and frequent. For negative video modulation such as that used in CCIR Systems B, D, G, K, M and N, the synchronization, blanking and color burst are always at power levels higher than video picture content. The peak value during the synchronization pulse is the highest, followed by the peak value of the burst, followed by the value of the blanking level.

More specifically, in CCIR System M, the transmitter must generate the greatest amount of power for the duration of the synchronization pulse, 4.7 microseconds out of a 63 microsecond period. Therefore, without modification, the combining network in the '931 patent can only be 100% power efficient for about 7.4% ((4.7/63)×100) of the time.

Figure 2:
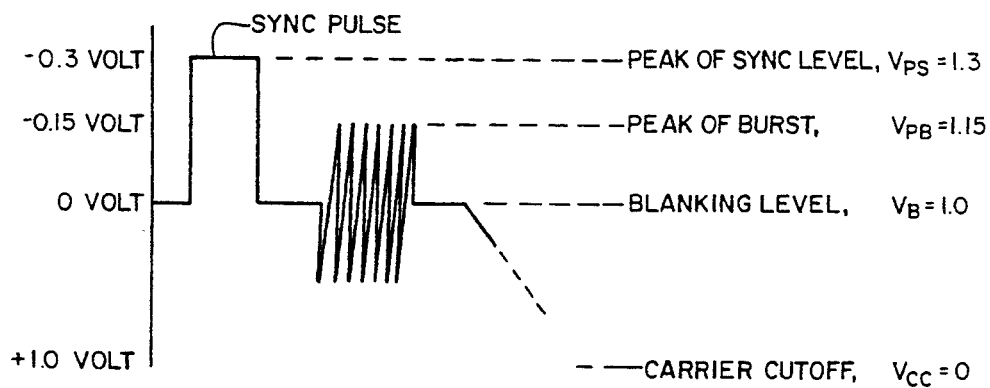
FIG. 2 illustrates a CCIR system M format analog television signal, including a synchronization pulse of full amplitude.

FIG. 2 illustrates relative voltage levels as a function of time for a typical analog television format.

"Blanking level" represents the carrier level, or the output when no modulation is applied. Relating to the analog waveform of FIG. 2, the amplifier stages of all n stages and the combiner power efficiency that may be calculated by formula (101) yield the same result as finding the ratio of the instantaneous voltage level of a point on the waveform of modulation to the peak of synchronization value, both measured relative to the carrier cutoff level Vcco. That is, $$\eta = \frac{v}{v_{ps}} = \frac{\left[1 + \sum_{k=1}^{n} m_k 2^{k-1}\right]}{2^n} \quad (102)$$

where $V_{ps}$ is the peak magnitude during the synchronization pulse and $m_k$ is the modulation index (0=off, 1=on) of the k-th bit of the binary signal on path 40 and n is the number of bits in the word. Given this, $V = V_{ps}$ and all $m_k = 1$ for any n, and the combiner efficiency at peak (synchronization) level is 100%.

Figure 3:
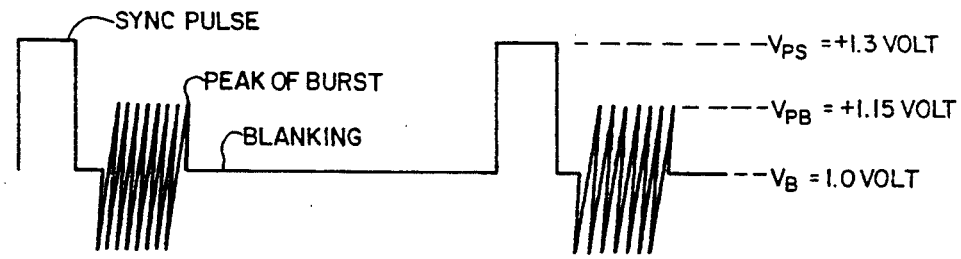
FIG. 3 illustrates a CCIR System M format analog television blanking level ("blacker than black") signal.

For "continuous blanking level" (a continuous "blacker than black" picture) with a synchronization and burst modulation signal such as that illustrated in FIG. 3, 100% power efficiency is realized only for the duration of the synchronization pulse. Efficiency $\eta$ at blanking is:

$$\eta = \frac{v_B}{v_{ps}} = \frac{1.0}{1.3} \; 100 = 76.9\% \quad (103)$$

(where $v_b$ is the average voltage during the blanking signal period) or 23.1% less than the ideal peak of synchronization efficiency. Considering that only 7.4% of the time is spent at synchronization peak level, while 92.6% of the time is spent at average blanking level (a worst case continuous "blacker than black" signal), the first aspect of the invention makes use of the realization that, if a way can be found to enhance the combining power efficiency at the blanking level, it should be used to enhance the overall power efficiency of the transmitter.

As introduced briefly above, in the Summary of the Invention, the first aspect of the present invention provides a reduced maximum amplitude input signal level (for example, a reduced-amplitude synchronization pulse in an analog television signal format). In particular, the synchronization pulse peak does not rise above the peak amplitude of a (for example, burst) signal.

Unmodified signals of CCIR system format, in arbitrary video mode and in continuous blanking mode, are illustrated in FIGS. 2 and 3, respectively. According to a preferred embodiment applying the first aspect of the present invention, the synchronization pulse peak is reduced to only half that of the synchronization pulse referenced to blanking in a CCIR system. If a synchronization peak exactly equals the level of peak of burst, a waveform such as that shown in FIG. 4 results.

Combiner power efficiency, $\eta$, at the blanking level would be $$\eta = \frac{v_B}{v_{ps}} = \frac{1.0}{1.15} \; 100 = 87\% \quad (104)$$

For a synchronization pulse reduced in amplitude to, for example, the peak level of the burst, transmitter combiner efficiency is increased more than 10% when power efficiency is most important (at blanking).

To retrieve full amplitude of the synchronization pulse level at the output of the modulator-transmitter, the gain of the nth (most significant bit) amplifier $44_n$ is increased during the synchronization pulse by, for example, increasing its supply voltage.

According to the first aspect of the invention described in the Summary of the Invention, instantaneous power output from the power combiner at the peak of the burst from a television transmitter using System M may be calculated from FIG. 3:

$$P_{PB} = \left(\frac{v_{PB}}{v_{PS}}\right)^2 P_{PS} = \left(\frac{1.15}{1.3}\right)^2 P_S = 0.782 \; P_S \quad (105)$$

Figure 4:
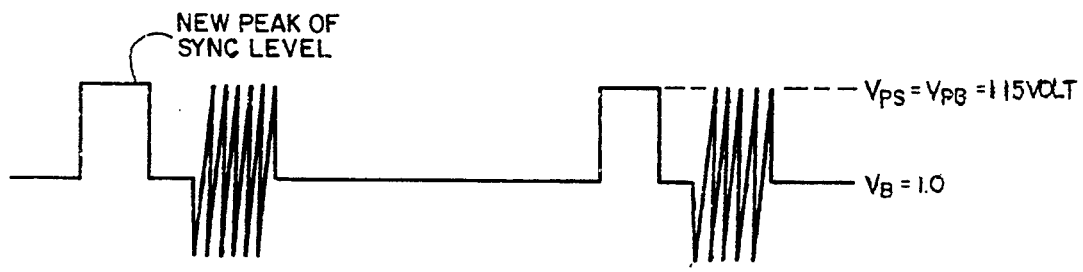
FIG. 4 illustrates how the signal of FIG. 3 may be modified according to a first aspect of the present invention.

Therefore, assuming burst peak level and a reduced synchronization pulse peak level as shown in FIG. 4, a transmitter rated for a full power synchronization pulse $P_{ps}$ is required to generate only 0.782 $P_{ps}$. Here, when all $m_k = 1$ (that is, when all switches $42_1$-$42_n$ are ON), the summed output power must be 78.2% that of full transmitter capability during the synchronization pulse while the nth amplifier is pulsed to full power to reach full $P_{ps}$. Half of 0.782 $P_{ps}$ comes from the nth bit amplifier while not pulsed and the other half comes from the summation of all other bits, k=1 to k=n−1:

$$P_n = \frac{0.782}{2} P_{ps} = 0.391 \; P_{ps} \quad (106)$$

If the synchronization pulse is not reduced to the burst peak level, but of full height as in the '931 patent, then Equation 11 in the '931 patent implies that:

$$P_{out\;max} = 2P_n$$

where $P_{out\;max} = P_{ps}$ \quad (107)

or $P_n = 0.5 \; P_{ps}$

All amplifiers from the least significant bit to the most significant bit need only produce 0.391/0.5×100, or 78.2%, of the power, for a summed total of 0.782 $P_{ps}$. The remaining power that sums to $P_{ps}$, (that is, 0.218 $P_{ps}$), comes as a result of increased-amplitude pulsing of the nth bit amplifier $44_n$ to make up the difference at the output port of the most significant combiner $32_n$.

Figure 5:
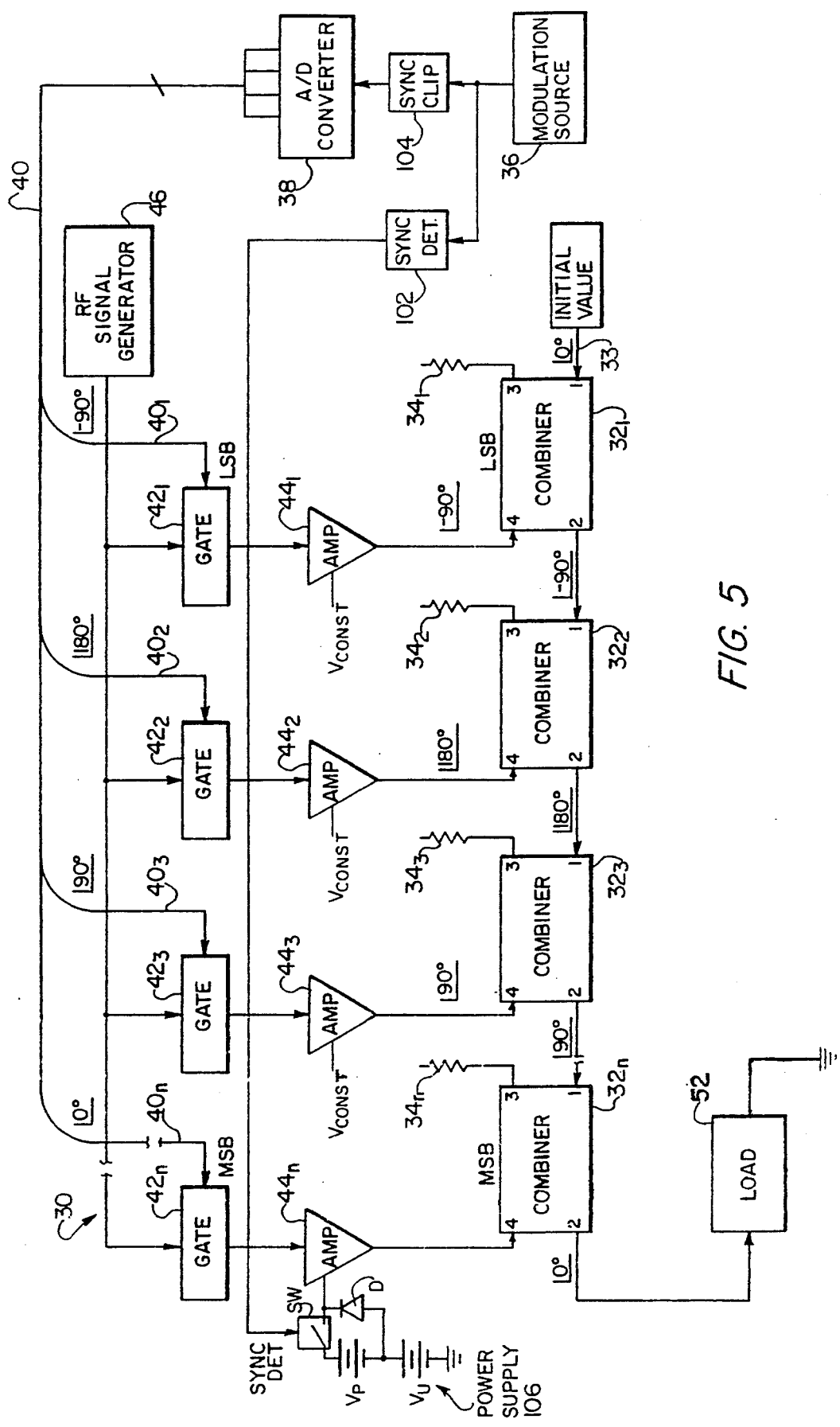
FIG. 5 illustrates schematically a modification of the system of FIG. 1 embodying the first aspect of the present invention.

In particular, FIG. 5 illustrates the last of the stages of an n-stage power combiner. Half the 0.782 $P_{ps}$ power comes from bit controlled amplifiers k=1 to k=n−1, and the other half of $P_{ps}$ from the nth bit amplifier itself. As long as the combiner input powers are equal (and assumed at the constant 90° phase shift from each other), no power is lost to the reject loads $34_k$.

During the synchronization pulse, the output power from the nth bit amplifier may be found from equation (2) of the '931 patent:

$$P_o = \left(\sqrt{\frac{P_{in1}}{2}} + \sqrt{\frac{P_{in2}}{2}}\right)^2 \quad (108)$$

If $P_n = P_{in2}$, $$P_{in1} = \sum_{k=1}^{n-1} P_k$$

and $P_o = P_{ps}$, the referenced equation becomes:

$$P_{ps} = \left( \sqrt{\frac{\sum_{k=1}^{n-1} P_k}{2}} + \sqrt{\frac{P_n}{2}} \right)^2$$

with $$\sum_{k=1}^{n-1} P_k = 0.391 \, P_s.$$

$P_n$ is determined to be that value required to produce full synchronization power, $P_{ps}$, during the synchronization pulse:

$$P_n = 0.622 \, P_{ps} \qquad (109)$$

To show that the unequal power levels from all $k=1$ to $k=n-1$, (that is, $0.391 \, P_{ps}$) and that from the nth bit (that is, $0.622 \, P_{ps}$) add to $P_{ps}$ during synchronization period pulsing, equation (2) from the '931 patent is again used:

$$P_{ps} = \left( \sqrt{\frac{0.391 \, P_{ps}}{2}} + \sqrt{\frac{0.622 \, P_{ps}}{2}} \right)^2 \qquad (110)$$

$$P_{ps} = P_{ps}$$

The power lost to the nth combiner reject load, $34_n$, in FIG. 5 is shown from equation (3) of the '931 patent to be:

$$P_{RL} = \left( \sqrt{\frac{0.391 \, P_{ps}}{2}} - \sqrt{\frac{0.622 \, P_{ps}}{2}} \right)^2 \qquad (111)$$

$$P_{RL} = 0.013 \, P_{ps}$$

This power loss occurs only during the synchronization pulse. This small loss of combiner efficiency (which only occurs 7.4% of the time) is insignificant when compared to the gain of more than 10% in power efficiency during 92.6% of the time during a continuous "blacker than black" video picture.

The change in the power supply voltage to the nth bit amplifier $44_n$ is determined to be that which allows it to be increased to $0.622 \, P_{ps}$ from $0.391 \, P_{ps}$ during the synchronization pulse. Values depend on the amplifying device being used, but it is obvious that the supply voltage causing $0.622 \, P_{ps}$ is greater than that needed at $0.391 \, P_{ps}$.

A circuit which embodies the first aspect of the present invention is shown schematically in FIG. 5.

The amplitude of the analog input signal may be modified during the synchronization pulse period in the following manner.

A synchronization pulse detector 102 and a synchronization clipper element 104 are connected to the output of the analog modulation signal source 36. The nth (MSB) amplifier power supply 106 receives the output of the synchronization detector. The input of the A/D converter 38 receives the output of the synchronization clipper 104.

In operation, the synchronization pulse detector 102 receives the input analog signal from source 36, and detects when the synchronization pulse period is being experienced.

During periods when a synchronization pulse is not being experienced, the synchronization detector is idle, causing no pulsing of the MSB amplifier's power supply 106. The modulating signal passes through the synchronization clipper unchanged.

However, during periods when the synchronization pulse is being experienced, the synchronization detector causes the MSB amplifier power supply 106 to be pulsed to a higher voltage. Also, the synchronization pulse is clipped to the peak of burst level by the synchronization clipper 104 before it is passed to the A/D converter 104.

Of course, alternative ways of reducing the synchronization pulse amplitude lie within the contemplation of the present invention. For example, the selective reduction of a portion of the analog waveform can be performed in the digital domain. That is, by sensing the occurrence of a maximum value (such as a synchronization pulse in our example) at the output of either analog source 36 or A/D converter 38, a suitable amplitude reduction element, this time digitally implemented in place of analog element 104, can be used within or at the output of A/D converter 38. The particular manner of reduction of the high-amplitude portion of an input waveform does not lie at the heart of the present invention, and a variety of means of waveform modification may be realized by those skilled in the art without departing from the scope of the present invention.

The foregoing modification of the waveform during the synchronization pulse is compensated for, in the following manner.

As also illustrated in FIG. 5, a switch SW is shown in series with first and second voltage sources $V_p$ and $V_u$, to ground. Switch SW may be a power field effect transistor (FET) such as a HEXFET gated ON by synchronization pulse detector 102. Connected in parallel to the series combination switch SW and $V_p$ is a diode D. When the amplifier $44_n$, preferably a Class C amplifier, is powered during a synchronization pulse, a full magnitude of voltage $V_p + V_u$ is passed through switch SW to the power input of amplifier 44. During this time, diode D prevents short circuiting of current between positive terminal of voltage source $V_p$ to the positive terminal of voltage source $V_u$.

Conversely, when switch SW is not closed (not during a synchronization pulse), voltage source $V_p$ is effectively removed from the circuit. Only voltage source $V_u$ provides current through diode D to the power input of amplifier 44.

The power inputs to the remaining amplifiers $44_1$-$44_{n-1}$ are kept at a constant voltage level $V_{CONST}$.

In this manner, the amplifier corresponding to the most significant bit effectively compensates for the lowered synchronization pulse amplitudes governing amplifiers of the less significant bits.

Another desirable feature of the first aspect of the invention is improved digital modulation of sampled analog video, for levels from peak level of the burst, down to carrier cutoff. According to the first aspect of the invention, the same n bits are used to express video in the range from $+1.0$ (or Vcco) to $-0.15$ (or $V_{pb}$)

instead of from +1.0 (or Vcco) to −0.3 (or $V_{ps}$). This provides a resolution improvement of:

$$20 \log\left(\frac{1.3}{1.15}\right) = 1.06 \text{ dB} \qquad (112)$$

for the CCIR M television format.

In summary, when considered as an improvement to the modulator of the '931 patent, the first aspect of the present invention provides a modulator for modulating an input information signal to provide a modulated information signal, the modulator having a circuit for determining when a magnitude of the input information signal is at or above a given magnitude threshold, and means for providing a modified input information signal in response to the means for determining. The modulator also has several component signal generation devices, the component signal generation devices outputting a corresponding plurality of component signals, in which each component signal output generally has a strength that is a predetermined multiple of a strength of a component signal of a preceding component signal generation device, and in which the modified input information signal controls the magnitude of the plurality of component signals. The modulator also has means for compensating for a difference between the input information signal and the modified input information signal, the means for compensating increasing the magnitude of a component signal output by a component signal generation device other than a least significant component signal generation device. Finally, the modulator has several combiners arranged in cascade, each combiner being connected to a respective component signal generation device, in which each combiner after a first combiner combines (i) a combiner output from a previous combiner and (ii) the component signal output from its respective component signal generation device, and in which a last combiner provides the modulated information signal as indicative of a sum of the component signals.

Applicant now describes a second aspect of the present invention.

Figure 6:
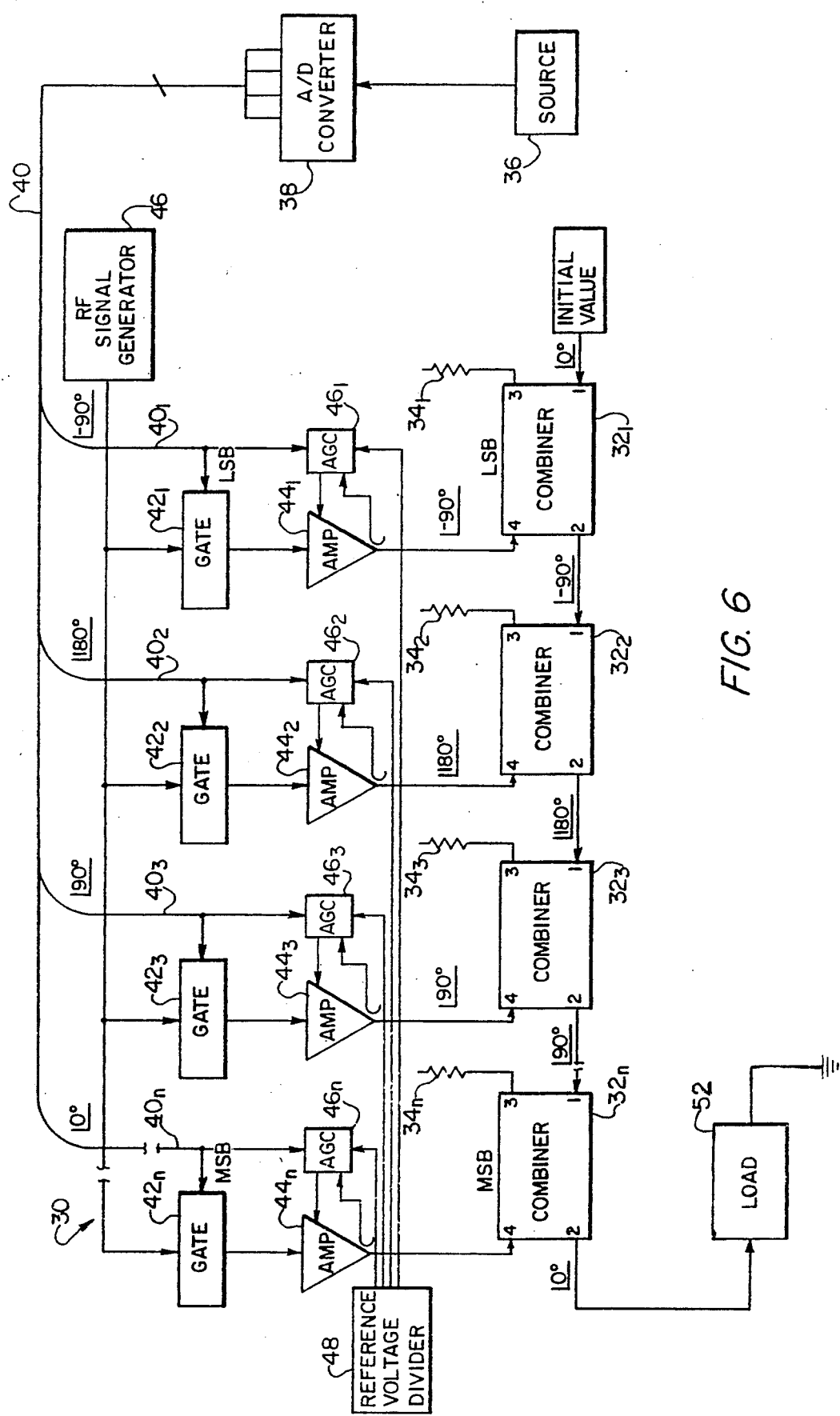
FIG. 6 illustrates an embodiment of the second aspect of the present invention.

An embodiment illustrating the second aspect of the invention is shown in FIG. 6. In FIG. 6, automatic gain control circuits $46_1$, $46_2$, $46_3$ ... $46_n$ are provided to drive gain control ports of respective amplifiers $44_1$, $44_2$, $44_3$ ... $44_n$. The automatic gain control circuits $46_1$, $46_2$, $46_3$ ... $46_n$ (hereinafter generically referred to as element 46) receive inputs from three sources.

The first input is from the output of the respective amplifier, preferably by means of a directional coupler. The second input to the automatic gain control is from a respective binary digit passing along path 40 from A/D converter 38. Finally, a third input to the automatic gain control circuit is from an appropriate output of a voltage divider circuit 48.

Each automatic gain control circuit 46 is described in greater detail below, with reference to FIG. 7. The voltage divider circuit is described in greater detail with reference to FIG. 8.

Figure 7:
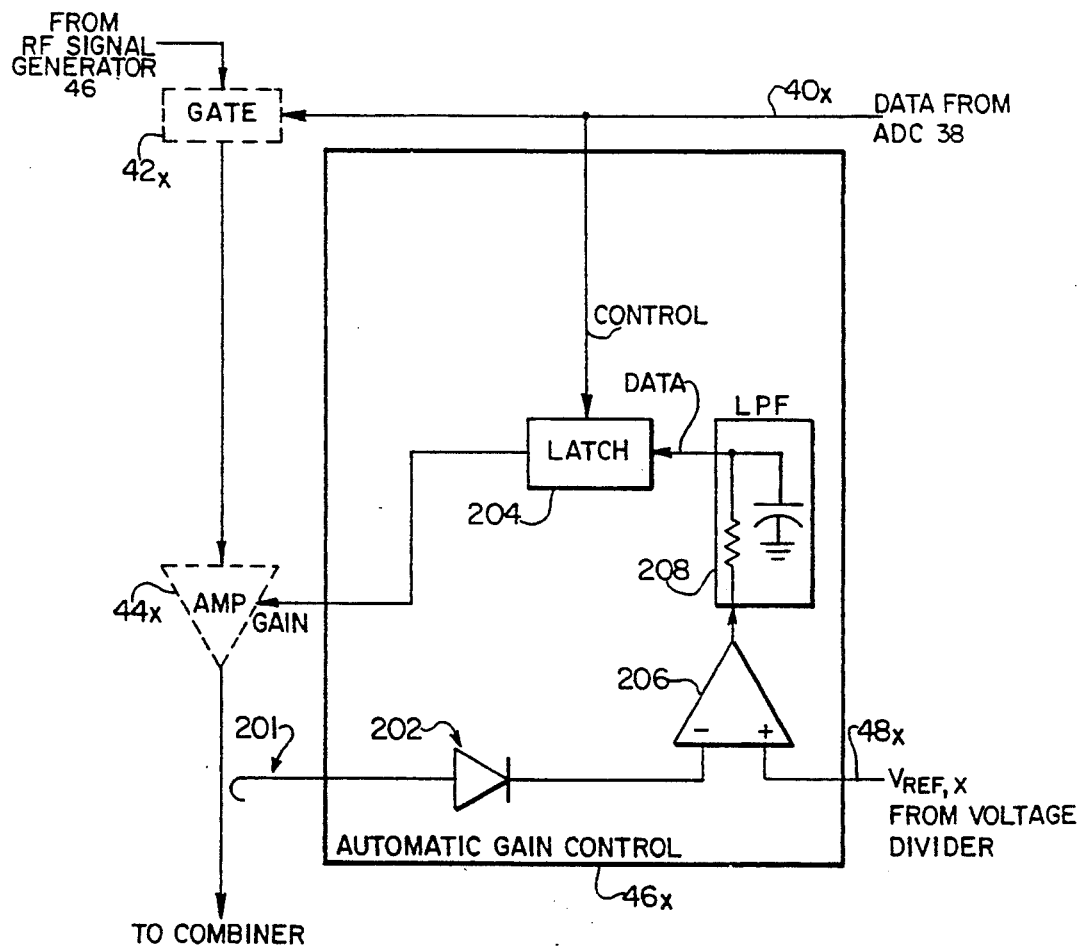
FIG. 7 illustrates an automatic gain control implementation of the second aspect of the present invention.

Referring to FIG. 7, a preferred embodiment of the automatic gain control circuit 46 is illustrated. The topology of the automatic gain control circuit may be identical for each implementation of the AGC elements $46_1$, $46_2$, $46_3$ ... $46_n$ (FIG. 6), but it is understood that the inputs to the automatic gain control circuit take on different signal values for each circuit $46_1$, $46_2$, $46_3$ ... $46_n$.

In FIG. 7, AGC circuit 46 is shown to include a directional coupler 201 and a diode 202 which couples the output of amplifier $44_x$ to the inverting input of a comparator 206. The non-inverting input of comparator 206 receives a reference voltage $V_{REF,x}$ on path $48_x$ ($1 \leq X \leq n$) from voltage divider 48 (FIG. 6). Comparator 206 provides an output to a low pass filter 208.

Low pass filter 208 may include a simple series arrangement of a resistor R and a capacitor C to ground, with the intermediate node constituting the output of the low pass filter. Low pass filter 208 provides its output to the data input of a latch 204.

The control input of the latch 204 is driven by a binary value on path $40_x$ ($1 \leq X \leq n$) from A/D converter 38 (FIG. 6), which signal also drives the control input to gate $42_x$ ($1 \leq X \leq n$). The gate may be implemented as a pin diode.

Latch 204 provides an output to the gain control port of the driver within amplifier $44_x$.

In operation, latch 204 passes the filtered comparison signal from LPF 208, only when the binary value of the signal on path $40_x$ is 1. Conversely, when the binary signal on path $40_x$ is 0, latch 204 retains ("holds") the analog value that was presented to it by directional coupler and diode 201, 202 immediately before the binary transition from 1 to 0. Thus, latch 204 provides an output which tracks the filtered output of amplifier $44_x$ ($1 \leq X \leq n$) when gate $42_x$ ($1 \leq X \leq n$) is turned on, but holds the most recent analog value of the filter's output when gate $42_x$ is off and the output of amplifier $44_x$ is 0.

It is understood that, whereas the topology of AGC circuit 46 may be that illustrated in FIG. 7, the magnitudes of the signals on the paths will be different, depending on the bit significance x ($1 \leq X \leq n$). Because the magnitude of the power output by each amplifier varies exponentially with x, it is conceivable that when x is large, different circuit components appropriate to the voltage magnitudes may be employed. However, the particular implementation of circuit components lies readily within the ability of those skilled in the art, and is not central to the present invention.

During operation, if the sensed voltage at the directional coupler 201 is higher than it should be, the representative voltage presented to the inverting input of the comparator 206 will be greater than the reference voltage from the ladder network on path $48_x$. In this case, the output of the comparator 206 will go to its negative extreme value. When the output of comparator 206 goes to its negative extreme value, the smoothed comparator output provided by the low pass filter 208 also decreases, so that the gain of the driver stage of amplifier $44_x$ is correspondingly reduced.

Conversely, if the detected RF output voltage is lower than desired, the corresponding value at the inverting input of comparator 206 is lower than the reference voltage on path $48_n$, and the comparator output goes to its positive extreme. The output of the low pass filter 208 follows the comparator's output signal in a delayed manner, so as to provide compensating feedback to the gain control port of the driver of amplifier $44_n$. This in turn increases the gain of the amplifier, compensating for its previously sensed low value. This feedback loop constitutes an automatic gain control loop for the amplifier $44_x$.

The values of the components in AGC circuit 46 may be readily derived by those skilled in the art, applying established servo control theory. For example, the values of the resistor and capacitor in low pass filter 208 may be chosen without undue experimentation, because low pass filter 208 serves as a loop filter in a negative feedback loop. Each of the n RF amplifiers may be controlled in this manner, so that the circuit illustrated in FIG. 6 is optimally controlled.

Figure 8:
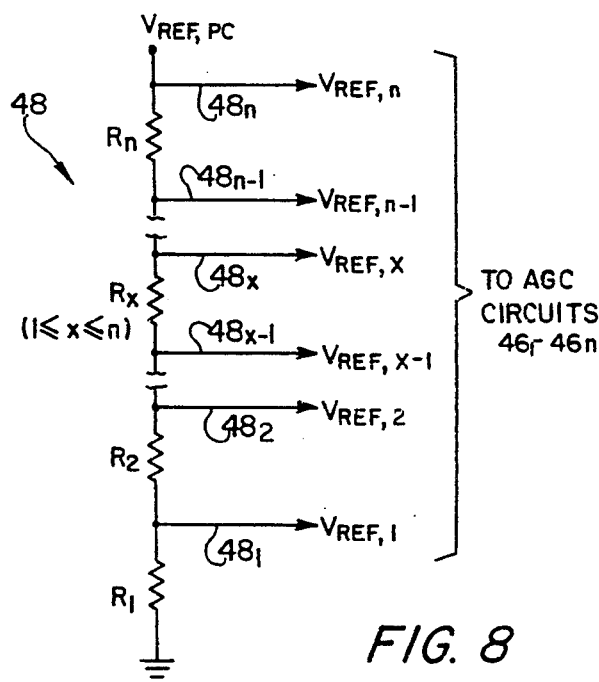
FIG. 8 illustrates in greater detail an implementation of the voltage divider 48 of FIG. 6.

Referring now to FIG. 8, a preferred embodiment of the voltage divider 48 is illustrated.

To understand the reasons behind the implementation illustrated in FIG. 8, the concept behind the modulator-transmitter of the '931 patent is important. In the '931 patent, the output power of successive amplifiers $44_1$, $44_2$, ... $44_n$, respectively representing increasingly significant bits of a binary word, are related by factors of 2. For example, if the least significant bit provides 1.0 watt of output power, then the second amplifier provides 2 watts; the third amplifier, 4 watts; the fourth, 8 watts; and so on, through the n-th amplifier, $2^{n-1}$ watts.

Each doubling of power represents a corresponding increase in RF output voltage. To accommodate the doubling of power, a reference ladder resistor network is derived as a series network representing a divided voltage circuit whose resistor values are specially related. Consecutive nodes in the divider have voltages that are related by $\sqrt{2}(1.4142 ...)$. In particular, assuming that the resistive voltage divider network includes series-connected resistors $R_1$, $R_2$, $R_3$ ... $R_n$, the nodes between each successive ascending resistor are related in the following manner.

$R_1$ is arbitrarily chosen while $R_2$ is found from $$\frac{R_1}{R_1 + R_2} = \frac{1}{\sqrt{2}} \qquad (201)$$

$$R_2 = (\sqrt{2} - 1)R_1 \approx 0.414 R_1$$

Now let $R_2' = R_1 + R_2$. $R_3$ is found from:

$$R_3 \approx 0.414 (R_1 + R_2) = 0.414 R_2' \qquad (202)$$

Letting $R_3' = R_1 + R_2 + R_3$:

$$R_4 \approx 0.414 R_3' \qquad (203)$$

It is sufficient to show that the resistive network exists out to any arbitrary $R_n$.

$$R_n = (\sqrt{2} - 1)R'_{n-1} \qquad (204)$$

$$R_n \approx 0.414 \sum_{k=1}^{n-1} R_k \qquad (205)$$

In addition to individually controlling the effective gain of the amplifiers $44_1$ ... $44_n$ by adjusting the voltage $V_{REF,PC}$ (PC means Power Control), one skilled in the art may readily control the gain for the entire modulator-transmitter.

The teachings of the second aspect of the invention (illustrated in FIG. 6), may be readily combined with those of the first aspect of the invention (FIG. 5). However, a potential complication arises, in that the first aspect of the invention requires that the amplitude of the power output from the amplifier of the highest-order bit be adjusted during a high-amplitude (for example, synchronization pulse) period. The highest-order resistor of the voltage divider network of FIG. 8 must be adjusted accordingly. Because the magnitude of the analog output pulse is changed away from the power-of-two pattern, the detected voltage at the direction coupler will be disproportionate, the voltage not having a $\sqrt{2}$-factor relationship with the others.

Figure 9:
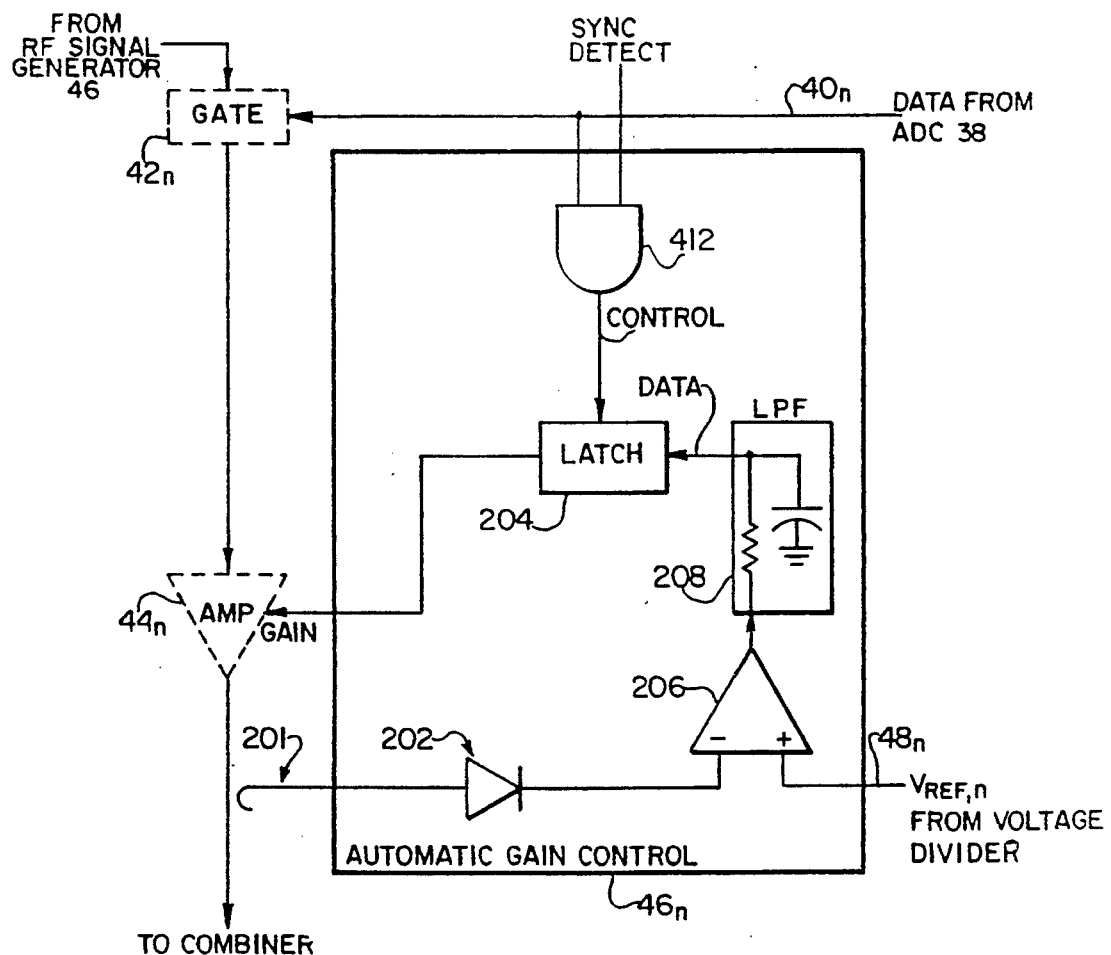
FIG. 9 illustrates a portion of an embodiment of a modulator when the first and second aspects of the invention are combined, showing how control of the automatic gain control element of the most significant bit is modified.

Referring to FIG. 9, a preferred embodiment for combining the first and second aspects of the present invention is schematically illustrated. The illustrated embodiment is similar to FIG. 7, with the exception that art AND gate 412 is provided. AND gate 412 provides the control input to the most significant latch 204 of the most significant automatic gain control element $46_n$, based on inputs from bit $40_n$ and the output signal from synchronization detector 102 (FIG. 5). It is emphasized that FIG. 9 is applicable only to the automatic gain control element of the most significant bit (n), and then, only if the first and second aspects of the invention are combined.

The second aspect of the present invention thus provides substantially constant binarily related power levels making up the output for the modulator-transmitter, by individually gain-controlling each of the amplifiers (to a common voltage reference) that contribute to the modulator-transmitter's output.

In summary, when considered as an improvement to the modulator of the '931 patent, the second aspect of the present invention provides a modulator for modulating an input information signal to provide a modulated information signal, the modulator having several component signal generation devices, the component signal generation devices outputting a corresponding number of component signals, in which each component signal output has a strength that is a predetermined multiple of a strength of a component signal of a preceding component signal generation device, and in which the input information signal controls the magnitude of the plurality of component signals. The modulator has several automatic gain control portions, connected to a corresponding number of component signal generation devices, for ensuring that each component signal generation device outputs component signals of substantially constant power over time. Finally, the modulator has several combiners arranged in cascade, and each combiner being connected to a respective component signal generation device, in which each combiner after a first combiner combines (i) a combiner output from a previous combiner and (ii) the component signal output from its respective component signal generation device, and in which a last combiner provides the modulated information signal as indicative of a sum of the component signals, the modulated information signal having a substantially constant output power over time due to the automatic gain control portions.

Applicant now describes a third aspect of the present invention.

Figure 10:
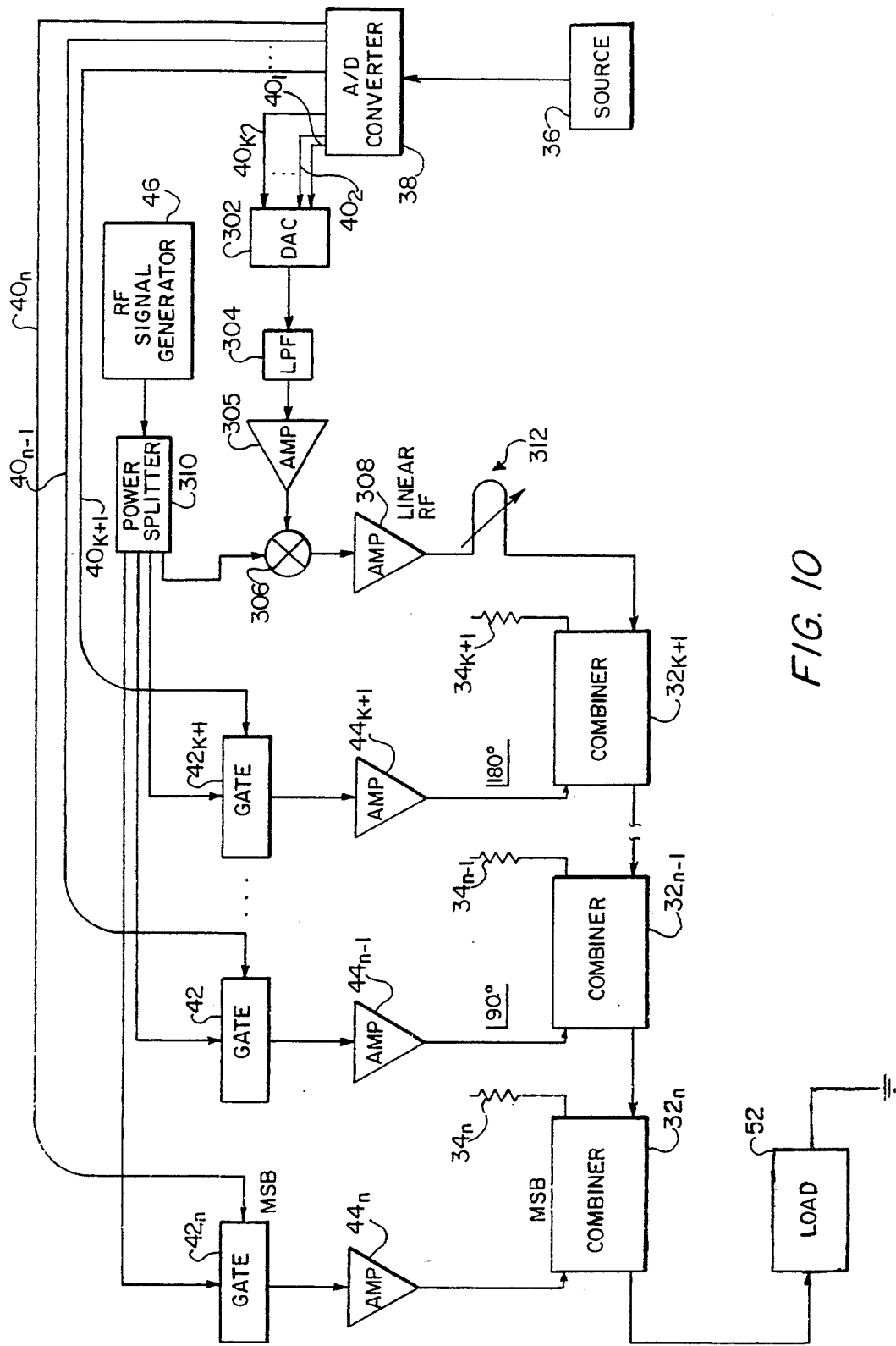
FIG. 10 illustrates an embodiment of the third aspect of the invention.

FIG. 10 illustrates an amplitude modulator-transmitter embodying teachings of the third aspect of the present invention.

In FIG. 10, an n-bit digital word is illustrated as an output of A/D converter 38. The more significant bits of the digital word output from A/D converter 38 are input to respective higher-order switches implemented as gates $42_n$, $42_{n-1}$, $42_{n-2}$ down to any arbitrary $42_{k+1}$. These switches govern conductance of a carrier generator passed through an n-k+1 way power splitter 310 to respective amplifiers $44_n$, $44_{n-1}$, $44_{n-2}$ down to $44_{k+1}$.

The extra output of the power splitter 310 functions as a carrier source for a mixer 306 (as described below).

The outputs of amplifiers $44_n$ through $44_{k+1}$ are input to respective combiners $32_n$ through $32_{k+1}$. The portion of the circuit of FIG. 10 which is digitally implemented, as described herein, may operate in conjunction with the teachings of the '931 patent, as well as with any combination of the first and second aspects of the present invention, described hereinabove.

Referring again to FIG. 10, the less significant bits output from A/D converter 38 (that is, 1 through k) are input to a D/A converter. Thus, D/A converter (DAC) 302 outputs an analog signal representative of the less significant bits of the original analog input signal to a low pass filter (LPF) 304 and an amplifier 305.

Amplifier 305, preferably implemented as a video operational amplifier, receives input from the low pass filter 304. Amplifier 305 provides a band-limited amplified baseband output signal to mixer 306. Amplifier 304 adjusts the modulation level, envelope time shift, and carried level for all bits from 1 to k.

Mixer 306 receives a second input from n-k+1 way power splitter 310. Mixer 306 provides an output to a linear RF amplifier 308. Finally, amplifier 308 provides its output to the first input of combiner $32_{k+1}$.

For the less significant bits illustrated, a composite analog signal is restored by D/A converter 302. This new "partial video signal" modulates a carrier signal from the n-k+1 way carrier splitter 310, at mixer 306. This modulation is accomplished by use of a mixer which may be a mixer with modulation input capability from DC to RF. The resultant signal output from the mixer is adjusted to have the proper gain, DC (or carrier injection) level, and RF level and phase shift using a linear RF amplifier 308, as well as an RF "line stretcher" 312 extending from the output of amplifier 308 to combiner $32_{k+1}$.

In the embodiment illustrated in FIG. 10, only n-k non-linear high efficiency RF amplifiers need to be constructed. They are used in the portion of the signal that is more significant from a power standpoint.

A single low power RF linear amplifier 308 provides only a very small portion of the total output power if k is chosen to be small relative to n. The only other amplifier is the video amplifier 304, adjusted to cause mixer 306 to provide the right carrier level, modulation level, and envelope time shift for all the less significant bits.

In view of the foregoing, those skilled in the art are readily capable of understanding that the higher-order bits (in this example, bits k+1 through n) are processed in a digital manner, while the bits of lower significance (here, bits 1 through k) are processed in analog circuitry. As described above, elements $42_n$-$42_{k+1}$, $44_n$-$44_{k+1}$, and $32_n$-$32_{k+1}$ may be said to constitute a digitally-processed portion of the amplitude modulator-transmitter. Conversely, elements 304, 306, and 308 may be said to constitute an analog-processed portion of the amplitude modulator-transmitter by reconstructing bits 1 through k.

According to the teachings of the present invention, any given number of bits may be allocated to the digitally processed portion, and the remainder to the portion which is processed using analog circuitry. It is understood that the power-saving advantages of the present invention are best applied to the most significant bits. In contrast, the less-significant bits (representing less output power to begin with) are processed using analog circuitry which does not possess the advantages described above and in the '931 patent.

As a background to understanding the advantages of the third aspect of the present invention, it is understood that in amplitude modulator-transmitters such as that used for television broadcasting, n is an arbitrarily large or small number, depending on whatever level of quantization error is considered to be acceptable. The word length n may be quite large in order to provide information of broadcast quality, or to provide information of quality needed for any arbitrary modulation waveform. The power efficiency, and therefore the reduction in operating cost of a modulator-transmitter, is a major reason for using non-linear RF amplifiers in a modulation process which is linear.

The implementation illustrated in FIG. 10 reflects the realization that it is advantageous not to use nonlinear RF amplifiers, where power efficiency saving is less significant. For example, for power amplifiers having outputs which are consecutive multiples of two with respect to adjacent amplifiers, such as those in FIG. 14 of the '931 patent, the power output of the n-th amplifier, feeding the combiner which is the most significant, is required to provide twice the RF power as the adjacent amplifier, $44_{n-1}$. FIG. 10 embodies the realization that the most power can be saved by efficiently using power with respect to the more significant amplifiers. In contrast, those at lower levels, further to the right of FIG. 14 of the '931 patent, would offer correspondingly less power savings for a given percentage increase in power efficiency.

If there are n bits in the word, the n-th bit alone makes up half the total power broadcast by the transmitter. Thus, $P_n = \frac{1}{2} P_{out}$ Furthermore, $P_{n-1} = \frac{1}{4} P_{out}$ $P_{n-2} = \frac{1}{8} P_{out}$ $P_{n-3} = 1/16$ $P_{out}$ $P_{n-4} = 1/32$ $P_{out}$ Thus, the five most significant amplifiers make up $\frac{1}{2} + \frac{1}{4} + \frac{1}{8} + 1/16 + 1/32 = 96.88\%$ of the total output power. Total power efficiency that would be gained by digitizing the remaining bits would be relatively insignificant, since they collectively provide only 3.12% of the overall transmitter power. For these less significant bits, the complexity of the modulator-transmitter is greatly reduced using the embodiment shown in FIG. 10, because they are returned to analog form and amplified to a proper power level and phase before being connected to the input of the next higher level power combiner $32_{k+1}$.

In summary, when considered as an improvement to the modulator of the '931 patent, the third aspect of the present invention provides a modulator for modulating an input information signal to provide a modulated information signal, the modulator having several component signal generation devices, the component signal generation devices outputting a corresponding number of component signals, in which each component signal output has a strength that is a predetermined multiple of a strength of a component signal of a preceding component signal generation device, and in which more significant portions of the input information signal control the magnitude of the plurality of component signals. The modulator has an analog portion for providing an analog signal indicative of less significant portions of the input information signal. The modulator also has several combiners arranged in cascade, and each combiner being connected to a respective component signal generation device, in which each combiner after a first combiner combines (i) a combiner output from a previous combiner and (ii) the component signal output from its respective component signal generation device, and in which the first combiner combines (i) the analog signal indicative of the less significant portions of the input information signal and (ii) the component signal output from its respective component signal generation device, and in which a last combiner provides the modulated information signal as indicative of a sum of the component signals.

The first and second aspects of the present invention, described above, may readily be combined with the present, third, aspect of the invention.

Modifications and variations of the above-described embodiments of the present invention are possible, as appreciated by those skilled in the art in light of the above teachings. It is therefore to be understood that, within the scope of the appended claims and their equivalents, the invention may be practiced otherwise than as specifically described.

What is claimed is:

1. A modulator for receiving an input information signal and providing a modulated information signal, the modulator comprising:
   a) means for determining when a magnitude of the input information signal is at or above a given magnitude threshold;
   b) means for providing a modified input information signal in response to the means for determining;
   c) a plurality of component signal generation devices, responsive to the modified input information signal, the component signal generation devices outputting a corresponding plurality of component signals having respective magnitudes which are affected by the modified input information signal;
   d) means for compensating for a difference between the input information signal and the modified input information signal, the means for compensating including means for increasing the magnitude of a component signal output by a component signal generation device other than a mathematically least significant component signal generation device; and
   e) means for combining the plurality of component signals output from the component signal generation devices and for providing the modulated information signal as indicative of a combination of the component signals.

2. The modulator of claim 1, wherein:
   each component signal output generally has a strength that is a predetermined multiple of a strength of a component signal of a preceding component signal generation device of less mathematical significance.

3. The modulator of claim 2, wherein: the predetermined multiple is 2.

4. The modulator of claim 1, wherein at least one of the component signal generation devices includes:
   a switched amplifier, the switched amplifier outputting a component signal of non-zero power when a corresponding bit of the input information signal is of one value, and outputting a component signal of zero power when the corresponding bit of the input information signal is of a second value.

5. The modulator of claim 1, wherein:
   the means for combining includes a plurality of combiners arranged in cascade;
   each combiner is connected to a respective component signal generation device;
   each combiner after a first combiner combines (i) a combiner output from a previous combiner of less mathematical significance and (ii) the component signal output from its respective component signal generation device; and
   a last combiner provides the modulated information signal as indicative of a sum of the component signals.

6. The modulator of claim 5, wherein each of the combiners comprises:
   a combiner outputting a sum of (i) the combiner output from the previous combiner of less mathematical significance and (ii) the component signal output from its respective component signal generation device.

7. The modulator of claim 1, wherein the means for compensating includes:
   means for providing a first amplification factor input to one of the component signal generation devices when the magnitude of the input information signal is at or above a given magnitude threshold; and
   means for providing a second amplification factor input to the one of the component signal generation devices when the magnitude of the input information signal is not at or above the given magnitude threshold, wherein the second amplification factor is less than the first amplification factor.

8. The modulator of claim 1, wherein:
   the means for compensating includes means for increasing the magnitude of a component signal output by a mathematically most significant component signal generation device that is connected to the last combiner that provides the modulated information signal.

9. The modulator of claim 1, wherein the means for determining includes:
   means for determining when the magnitude of the input information signal is large enough to be a synchronization pulse of an analog television signal.

10. The modulator of claim 9, wherein the means for providing a modified input information signal includes:
    means for providing a modified television signal in which a magnitude of a modified synchronization pulse is substantially the same as a peak of a color burst in the analog television signal.

11. The modulator of claim 10, wherein the means for providing a modified input information signal includes:
    means for providing the modified television signal in which the magnitude of the modified synchronization pulse is approximately half the magnitude of a synchronization pulse in the analog television signal, when measured with reference to a blanking level.

12. A modulator for receiving an input information signal and providing a modulated information signal, the modulator comprising:
    a) a plurality of component signal generation devices, responsive to the input information signal, the component signal generation devices outputting a corresponding plurality of component signals having respective magnitudes which are affected by the input information signal;
    b) a plurality of automatic gain control means, connected to a corresponding plurality of component signal generation devices, for ensuring that each component signal generation device outputs component signals of substantially constant power over time; and c) means for combining the plurality of component signals output from the component signal generation device and for providing the modulated information signal as indicative of a combination of the component signals, the modulated information signal having a substantially constant output power over time due to the automatic gain control means.

13. The modulator of claim 12, wherein at least one of the automatic gain control means is responsive to:
the component signal output from the corresponding component signal generation device; and
the input information signal.

14. The modulator of claim 12, wherein:
A) the modulator further comprises a reference generator having a plurality of reference outputs corresponding to the predetermined multiple; and
B) at least one of the automatic gain control means is responsive to:
1) the component signal output from the corresponding component signal generation device; and
2) a corresponding reference output.

15. The modulator of claim 12, wherein:
A) the modulator further comprises a reference generator having a plurality of reference outputs corresponding to the predetermined multiple; and
B) at least one of the automatic gain control means is responsive to:
1) the component signal output from the corresponding component signal generation device;
2) a corresponding reference output; and
3) the input information signal.

16. The modulator of claim 15, wherein at least one of the automatic gain control means includes:
a circuit means for (1) following the component signal from the corresponding component signal generation device when a bit of the input information signal has a first value but (2) holding a value of the component signal from the corresponding component signal generation device when a bit of the input information signal has a second value.

17. The modulator of claim 16, wherein at least one of the automatic gain control means further includes:
a comparator, responsive to (1) an output of the circuit means and to (2) the corresponding reference output, the comparator outputting a first value or a second value depending on which is greater.

18. The modulator of claim 17, wherein at least one of the automatic gain control means further includes:
a low pass filter, responsive to the comparator, the low pass filter providing a smoothed gain control output to the corresponding component signal generation device and thus constituting a loop filter.

19. The modulator of claim 12, wherein the reference generator includes:
a divider network including a series of divider elements arranged to provide respective divider levels.

20. The modulator of claim 19, wherein:
the reference generator includes a voltage divider network including a series of n resistors having respective values $R_1 ... R_n$; and $$R_n \approx (\sqrt{2} - 1) \sum_{k=1}^{n-1} R_k.$$

21. The modulator of claim 20, further comprising:
means to modify a single voltage by a scaling factor, so that voltages across respective resistors $R_1 ... R_n$ in the voltage divider network are modified in accordance with the scaling factor.

22. The modulator of claim 12, wherein:
each component signal output has a strength that is a predetermined multiple of a strength of a component signal of a preceding component signal generation device of less mathematical significance.

23. The modulator of claim 12, wherein:
the means for combining includes a plurality of combiners arranged in cascade;
each combiner is connected to a respective component signal generation device;
each combiner after a first combiner combines (i) a combiner output from a previous combiner of less mathematical significance and (ii) the component signal output from its respective component signal generation device; and
a last combiner provides the modulated information signal as indicative of a sum of the component signals.

24. A modulator for receiving an input information signal and providing a modulated information signal, the modulator comprising:
a) a plurality of component signal generation devices, responsive to the input information signal, the component signal generation devices outputting a corresponding plurality of component signals having respective magnitudes which are affected by mathematically more significant portions of the input information signal;
b) analog means for providing an analog signal indicative of mathematically less significant portions of the input information signal; and
c) means for combining (1) the plurality of component signals output from the component signal generation devices and (2) the analog signal indicative of the mathematically less significant portions of the input information signal, and for providing the modulated information signal as indicative of a combination of the component signals.

25. The modulator of claim 24, wherein the analog means includes:
a digital-to-analog converter, receiving mathematically less significant bits of a signal indicative of the input information signal and outputting an analog partial input information signal.

26. The modulator of claim 25, wherein the analog means further includes:
a low-pass filter, responsive to the analog partial input information signal from the digital-to-analog converter, and providing a band-limited analog partial input information signal.

27. The modulator of claim 26, wherein the analog means further includes:
an amplifier, connected to the low-pass filter, for altering the band-limited analog partial input information signal by adjusting one or more of its attributes including its DC or carrier level, its gain, and its modulation level, and for outputting an adjusted band-limited analog partial input information signal.

28. The modulator of claim 27, wherein the analog means further includes:
a mixer, responsive to the adjusted band-limited partial input information signal and to a carrier signal, the mixer providing a modulated carrier adjusted band-limited analog partial input information signal.

29. The modulator of claim 28, wherein the analog means further includes:
a linear amplifier, responsive to the modulated carrier adjusted band-limited analog partial input information signal to adjust its level and phase, to produce a combiner input signal that is input to an input of the first combiner.

30. The modulator of claim 24, further comprising:
a signal generator for generating a signal; and
a power splitter, responsive to the signal, for providing plural split signals to respective component signal generation devices.

31. The modulator of claim 24, further comprising:
a digital-to-analog converter, receiving mathematically less significant bits of a signal indicative of the input information signal and outputting an analog partial input information signal; and
a mixer, responsive to the analog partial input information signal and to a carrier signal, the mixer providing a modulated carrier signal that is used to generate the analog signal indicative of the mathematically less significant portions of the input information signal.

32. The modulator of claim 24, wherein:
each component signal output has a strength that is a predetermined multiple of a strength of a component signal of a preceding component signal generation device of less mathematical significance.

33. The modulator of claim 24, wherein:
the means for combining includes a plurality of combiners arranged in cascade;
each combiner is connected to a respective component signal generation device;
each combiner after a first combiner combines (i) a combiner output from a previous combiner of less mathematical significance and (ii) the component signal output from its respective component signal generation device; and
a last combiner provides the modulated information signal as indicative of a sum of the component signals.

* * * * *